(12) United States Patent
Gonzalez et al.

(10) Patent No.: US 7,177,195 B2
(45) Date of Patent: Feb. 13, 2007

(54) REDUCING THE EFFECTS OF NOISE IN NON-VOLATILE MEMORIES THROUGH MULTIPLE READS

(75) Inventors: Carlos J. Gonzalez, Los Gatos, CA (US); Daniel C. Guterman, Fremont, CA (US)

(73) Assignee: SanDisk Corporation, Milpitas, CA (US)

(*) Notice: Subject to any disclaimer, the term of this patent is extended or adjusted under 35 U.S.C. 154(b) by 0 days.

(21) Appl. No.: 11/191,823

(22) Filed: Jul. 27, 2005

(65) Prior Publication Data

US 2005/0259472 A1    Nov. 24, 2005

Related U.S. Application Data

(60) Continuation of application No. 10/799,416, filed on Mar. 12, 2004, now Pat. No. 6,952,365, which is a continuation of application No. 10/439,508, filed on May 16, 2003, now Pat. No. 6,785,164, which is a division of application No. 10/052,888, filed on Jan. 18, 2002, now Pat. No. 6,621,739.

(51) Int. Cl.
*G11C 11/34* (2006.01)

(52) U.S. Cl. ............... 365/185.21; 365/185.18
(58) Field of Classification Search ........... 365/185.21, 365/185.18
See application file for complete search history.

(56) References Cited

U.S. PATENT DOCUMENTS 4,630,086 A   12/1986  Sato et al.

(Continued)

FOREIGN PATENT DOCUMENTS

EP    0 548 564 A2   11/1992

(Continued)

OTHER PUBLICATIONS

Pohm et al., "The Design of a One Megabit Non-Volatile M-R Memory Chip Using 1.5×5 μm Cells," *IEEE Transactions on Magnetics*, vol. 24, No. 6, Nov. 1988, pp. 3117-3119.

(Continued)

*Primary Examiner*—Michael Tran
(74) *Attorney, Agent, or Firm*—Parsons Hsue & de Runtz LLP

(57) ABSTRACT

Storage elements are read multiple times and the results are accumulated and averaged for each storage element to reduce the effects of noise or other transients in the storage elements and associated circuits that may adversely affect the quality of the read. Several techniques may be employed, including: A full read and transfer of the data from the storage device to the controller device for each iteration, with averaging performed by the controller; a full read of the data for each iteration, with the averaging performed by the storage device, and no transfer to the controller until the final results are obtained; one full read followed by a number of faster re-reads exploiting the already established state information to avoid a full read, followed by an intelligent algorithm to guide the state at which the storage element is sensed. These techniques may be used as the normal mode of operation, or invoked upon exception condition, depending on the system characteristics. A similar form of signal averaging may be employed during the verify phase of programming. An embodiment of this technique would use a peak-detection scheme. In this scenario, several verify checks are performed at the state prior to deciding if the storage element has reached the target state. If some predetermined portion of the verifies fail, the storage element receives additional programming. These techniques allow the system to store more states per storage element in the presence of various sources of noise.

8 Claims, 4 Drawing Sheets

U.S. PATENT DOCUMENTS

| | | |
|---|---|---|
| 5,172,338 A | 12/1992 | Mehrotra et al. |
| 5,404,485 A | 4/1995 | Ban |
| 5,418,752 A | 5/1995 | Harari et al. |
| 5,457,658 A | 10/1995 | Niijima et al. |
| 5,471,478 A | 11/1995 | Mangan et al. |
| 5,603,001 A | 2/1997 | Sukegawa et al. |
| 5,712,180 A | 1/1998 | Guterman et al. |
| 5,717,632 A * | 2/1998 | Richart et al. ........... 365/185.2 |
| 5,724,284 A | 3/1998 | Bill et al. |
| 5,768,192 A | 6/1998 | Eitan |
| 5,787,484 A | 7/1998 | Norman |
| 5,890,192 A | 3/1999 | Lee et al. |
| 5,892,706 A | 4/1999 | Shimizu et al. |
| 6,044,019 A | 3/2000 | Cernea et al. |
| 6,103,573 A | 8/2000 | Harari et al. |
| 6,148,262 A | 11/2000 | Fry |
| 6,222,762 B1 | 4/2001 | Guterman et al. |
| 6,246,933 B1 | 6/2001 | Bague |
| 6,621,739 B2 * | 9/2003 | Gonzalez et al. ...... 365/185.21 |
| 6,785,164 B2 * | 8/2004 | Gonzalez et al. ...... 365/185.21 |
| 2001/0028576 A1 | 10/2001 | Miwa et al. |
| 2002/0196661 A1 * | 12/2002 | Banks .................... 365/185.03 |
| 2005/0185470 A1 * | 8/2005 | Suzuki et al. .......... 365/185.28 |

FOREIGN PATENT DOCUMENTS

| | | |
|---|---|---|
| EP | 1 096 501 A1 | 5/2001 |
| WO | WO 99/44113 | 9/1999 |
| WO | WO 01/61703 | 8/2001 |

OTHER PUBLICATIONS

Office Action for European Application No. 03 250 294.0 for SanDisk Corporation, Mailed Dec. 22, 2004, 4 pages.

European Search Report for European Application No. 03 250 294.0 for SanDisk Corporation, dated Apr. 17, 2003, 1 page.

International Search Report for International Application No. PCT/US 01/05052 for SanDisk Corporation, dated Apr. 15, 2002, 5 pages.

* cited by examiner

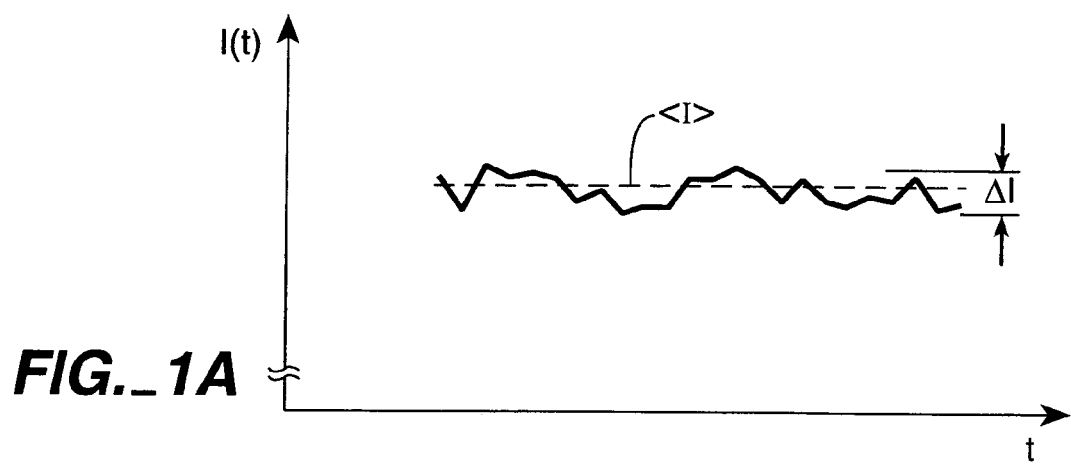
FIG._1A
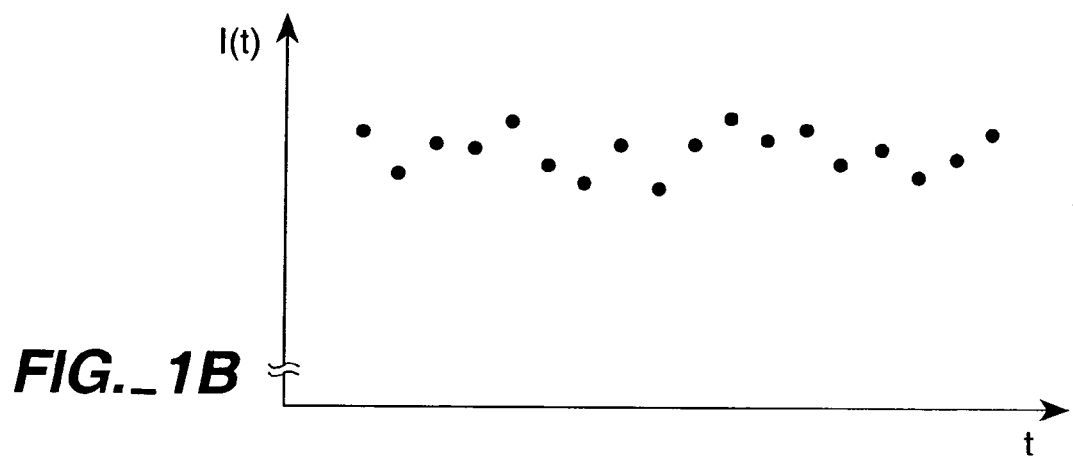
FIG._1B
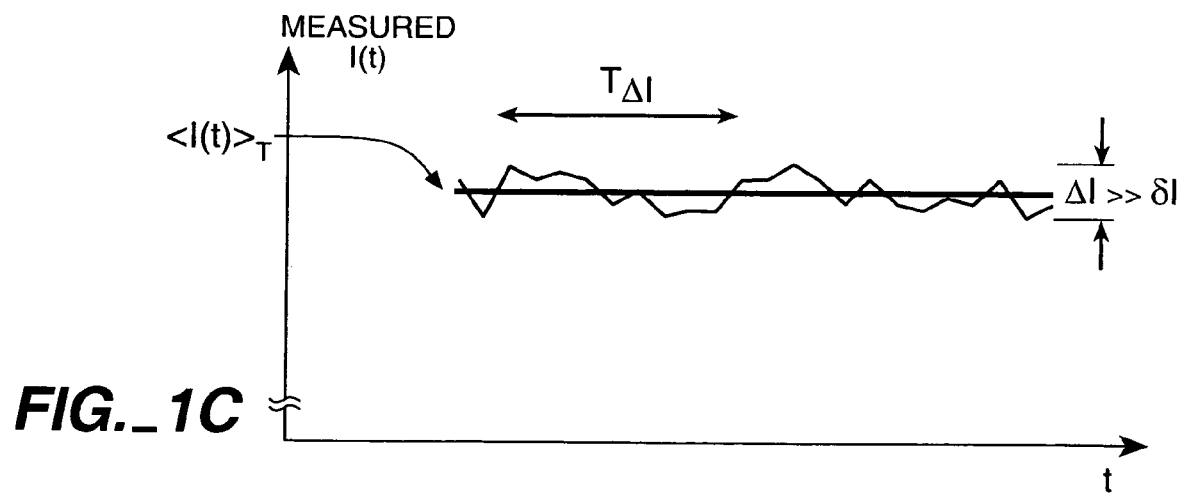
FIG._1C

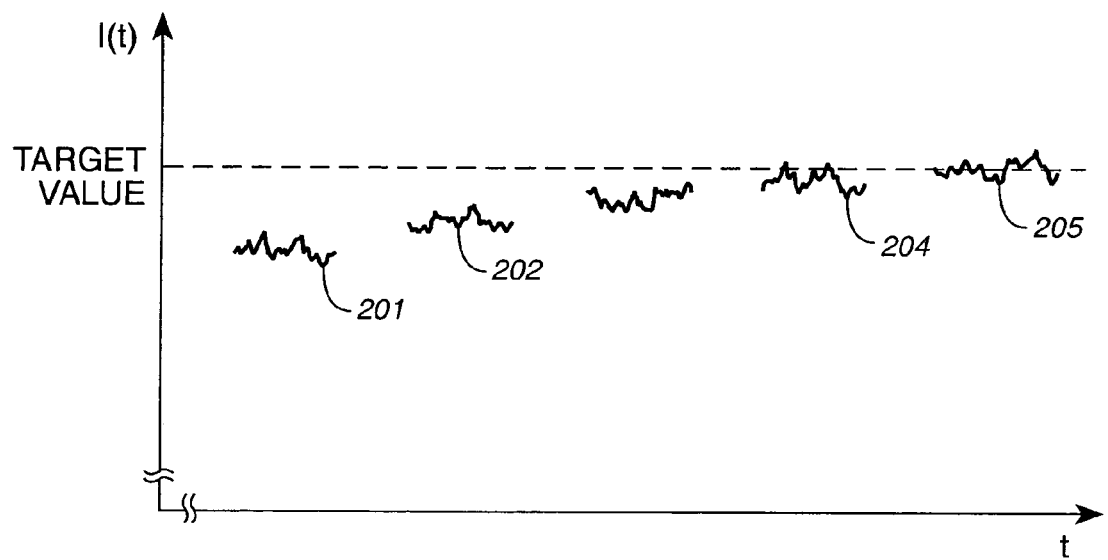
FIG._2
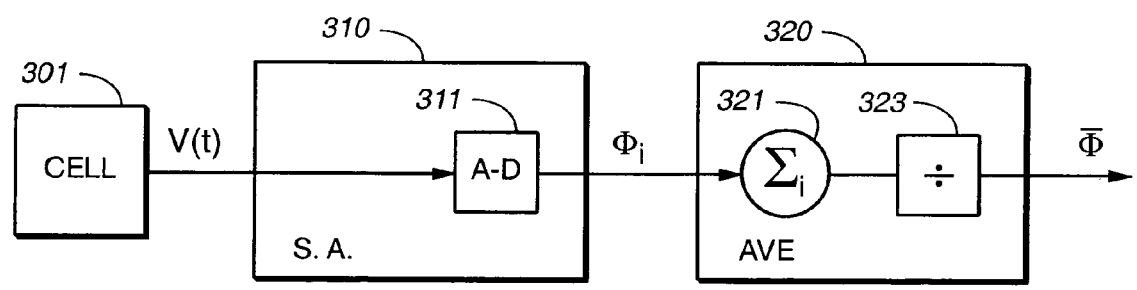
FIG._3

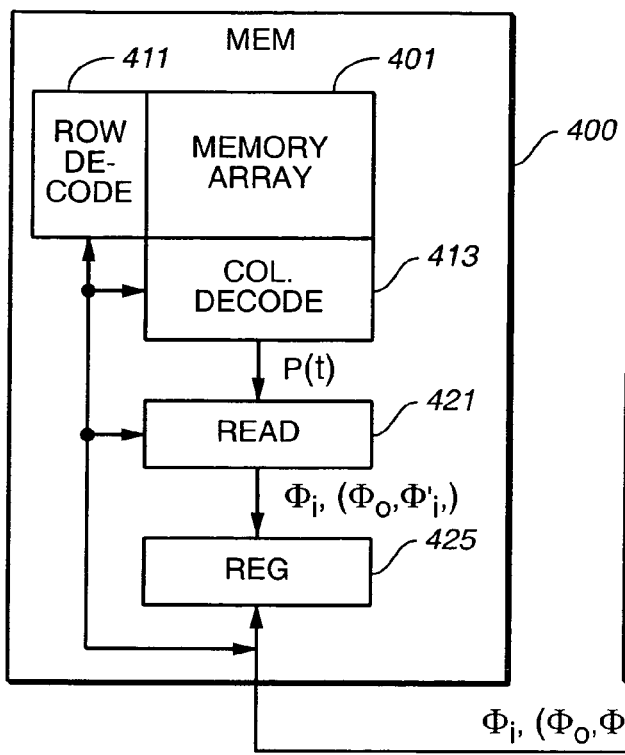
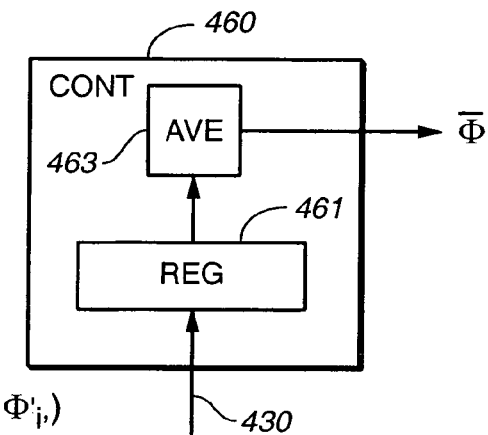
FIG._4A
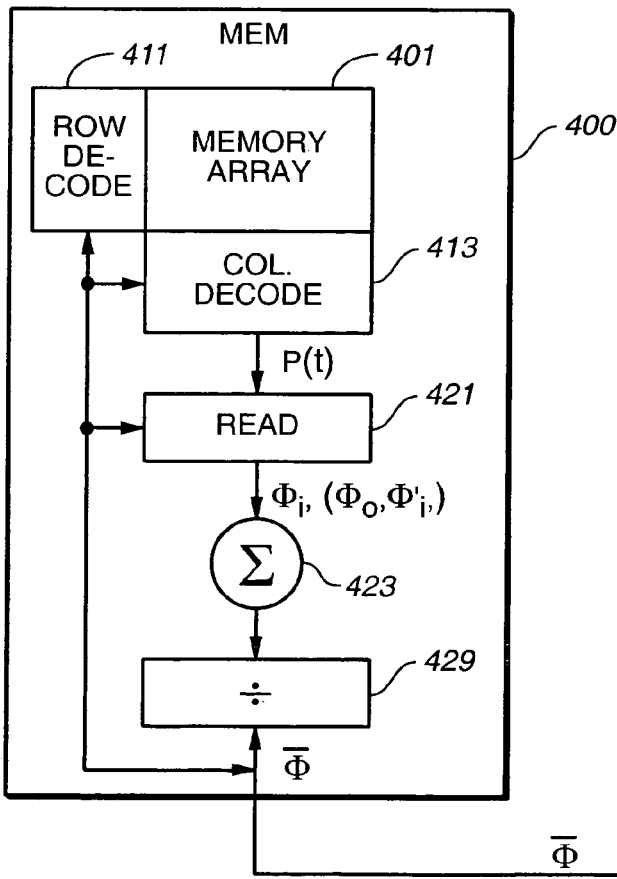
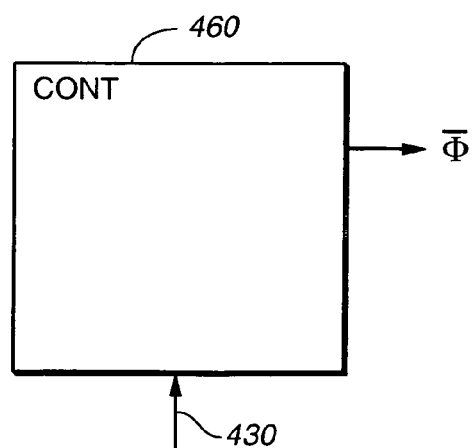
FIG._4B

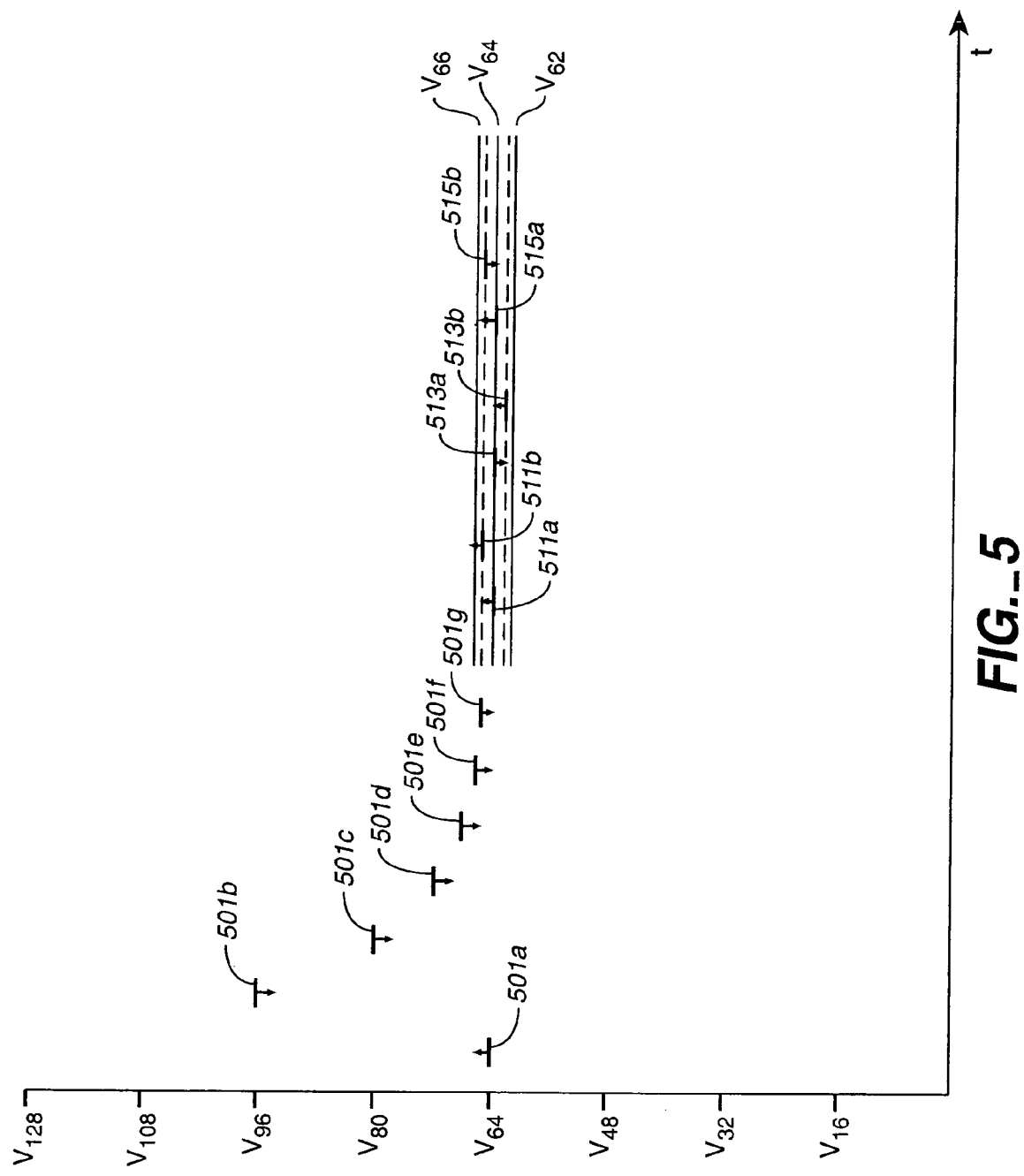
FIG._5

REDUCING THE EFFECTS OF NOISE IN NON-VOLATILE MEMORIES THROUGH MULTIPLE READS

This application is a continuation of application Ser. No. 10/799,416, filed Mar. 12, 2004 now U.S. Pat. No. 6,952,365, which is in turn a continuation of application Ser. No. 10/439,508, filed on May 16, 2003 now U.S. Pat. No. 6,785,164, which is in turn a division of application Ser. No. 10/052,888, filed on Jan. 18, 2002, now U.S. Pat. No. 6,621,739.

BACKGROUND OF THE INVENTION

1. Field of the Invention

This invention relates generally to computer readable memory devices, and, more specifically, to methods for reducing noise when reading their information content.

2. Background Information

In non-volatile semiconductor memories, such as EEPROMs, the amount of data stored per memory cell has been increased in order to increase storage densities. At the same time, the operating voltages of such devices have decreased to reduce power consumption. This results in a greater number states stored in a smaller range of voltage or current values. As the voltage or current separation between data states decreases, the effects of noise become more significant in the reading of these cells. For example, variations in the threshold value acceptable in a binary storage, 5 volts EEPROM cell may no longer be acceptable in a device operating at 3 volts with four or more bits storable per cell. Some consequences of noise, and methods for dealing with it, in a non-volatile memory are described in U.S. Pat. No. 6,044,019, which is hereby incorporated by reference.

An example of noisy behaviour is shown in FIG. 1A, which is adapted from U.S. Pat. No. 6,044,019. This figure shows the variation in the current flowing through a memory cell in response to a particular set of bias conditions. The current fluctuates by an amount ΔI due to various noise effects in the memory cell and interfacing circuitry. If, for example, the memory circuit works by current sensing, as the separation between states approaches ΔI, the noise will begin to produce erroneous read values. Although the consequences of noise can be decreased by integration sensing techniques, such as those in U.S. Pat. No. 6,044,019, or treated with error correction code (ECC) or other equivalent error management, such as is described in U.S. Pat. No. 5,418,752, which is hereby incorporated herein by this reference, memories could benefit from further methods to reduce the effects of noise on memory operation.

SUMMARY OF THE INVENTION

The present invention presents methods to further reduce the effects of noise in non-volatile memories, thereby allowing the system to store more states per storage element in circuits where noise and other transients are a significant factor. The storage elements are read multiple times by sensing a parameter indicative of their state. The results are accumulated and averaged for each storage element to reduce the effects of noise in the circuits as well as other transients that may adversely affect the quality of the read.

The methods of the present invention can be implemented through several techniques. In a first set of embodiments, a full read and transfer of the data from the storage device to the controller device is performed for each iteration, with averaging performed by the controller. In a second set of embodiments, a full read of the data for each interruption is performed, but the averaging is performed within the storage device and no transfer of data to the controller takes place until the final results are sent. A third set of embodiments perform one full read followed by a number of faster re-reads by exploiting the already established state information to avoid a full read, with some intelligent algorithm to guide the state at which the storage element is sensed. This technique may be used as the normal mode of operation, or invoked upon exception condition, depending on the system characteristics.

A similar form of signal averaging may be employed during the verify phase of programming. An exemplary embodiment of this technique would use a peak-detection scheme. In this scenario, several verify checks are performed at the target state prior to deciding if the storage element has reached the final state. If some predetermined portion of the verifies fail, the storage element receives additional programming.

Additional aspects, features and advantages of the present invention are included in the following description of specific representative embodiments, which description should be taken in conjunction with the accompanying drawings.

BRIEF DESCRIPTION OF THE DRAWINGS

FIGS. 1A–C show examples of noisy response in a memory cell.

FIG. 2 illustrates the effect of noise on a program and verify operation.

FIG. 3 is a schematic block diagram of the operation of the present invention according to an exemplary embodiment.

FIGS. 4A and 4B are block diagrams of circuit embodiments of some aspects of the present invention.

FIG. 5 is a schematic representation of binary search implementation of an exemplary embodiment.

DESCRIPTION OF REPRESENTATIVE EMBODIMENTS

The storage capacity of non-volatile semiconductor memories has increased both by the reduction in the physical size of the individual components of the circuits including the memory cell and by increasing the amount of data storable in an individual memory cell. For example, devices such as those described in U.S. Pat. Nos. 5,712,180 and 6,103,573 and U.S. patent application Ser. No. 09/505,555, filed on Feb. 17, 2000, and Ser. No. 09/667,344, filed on Sep. 22, 2000, which are all assigned to SanDisk Corporation and which are all hereby incorporated herein by this reference, can store four or more logical bits per physical floating gate storage transistor. In the case of four logical bits, this storage will require each floating gate to be able to have encoded within it one of sixteen possible memory states. Each one of these memory states corresponds to a unique value, or, more accurately, a narrow range of values, of stored charge on the floating gate which is sufficiently separated from its neighboring states' charge storage range of values to clearly differentiate it from those neighboring states as well as all the other states. This is true for both a normal read operation as well as for a verify read done as part of a programming operation.

A number of techniques for reading memory cells are described in U.S. patent application Ser. No. 09/671,793, filed on Sep. 27, 2000, and one entitled "Sense Amplifier for Multilevel Non-Volatile Integrated Memory Devices" by Shahzad Khalid, filed on Nov. 20, 2001, which are assigned to SanDisk Corporation and which are both hereby incorporated herein by this reference. The first of these applications describes reading the content of the memory cell with 7-bit or higher resolution for use in 4-bit storage. When this number of levels is contained in a 3 volt window of operating voltages as is typical in a FLASH memory, this results in approximately a 25 mV resolving capability. With this range, levels of noise formerly acceptable can now lead to the state of the cell being read with an error of one or more state levels.

FIGS. 1A–C illustrate examples of noise fluctuations in the reading of a memory cell. FIG. 1A shows the case where the value of some parameter indicative of the state of the memory cell, in this case the current I(t) fluctuates around some mean value <I>. In other embodiments, the memory can operate by reading voltage levels. If the value of the I(t) is read more or less instantaneously at regular intervals, the result would be something like what is shown in FIG. 1B. If instead the period over which the parameter indicating the state of the cell is read is several times longer than the typical time scale of the fluctuations, a relatively accurate value for the state of the cell can be determined. Some methods for accomplishing this are described in U.S. Pat. No. 6,044,019, from which FIGS. 1A and 1C are adapted and which has been incorporated by reference above.

As described in that patent, a memory cell has its source-drain current I(t) sensed by a sense amplifier. At the sense amplifier, I(t) typically has a noise component as illustrated in FIGS. 1A and 1C with noise fluctuations given by $\Delta I$. One special feature of the sense amplifier in that invention is to process this fluctuating current by means of an integrator, which effectively produces a time-averaged current $<I(t)>_T$ over a predetermined period T. An A/D module further converts the sensed analog, time-averaged current into a digital format corresponding to an output memory state $\Phi$.

FIG. 1C illustrates a source-drain current I(t) having noise fluctuations with a characteristic period $T_{\Delta I}$, and the resulting time-averaged $<I(t)>_T$ as processed by the sense amplifier of the present invention. The sensed source-drain current of a memory cell, I(t) has a time-dependent random noise component $\Delta I$. When I(t) is averaged over a sufficient period of time T, the noise fluctuations are substantially attenuated. The resultant error in $<I(t)>_T$ is given by $\delta I$ which is substantially less than $\Delta I$. The sufficient period of time for averaging would be a period T substantially greater than a characteristic time $T_{\Delta I}$ of the noise fluctuation. This $T_{\Delta I}$ can be defined as a period where a predetermined amount of noise fluctuation has been sufficiently attenuated.

For example, in many EEPROM or flash EEPROM devices, the characteristic fluctuation time $T_{\Delta I}$ has been estimated to be from 10 nanoseconds to several hundred nanoseconds. Thus, for these typical devices, the analog averaging or integration time T for the device described in U.S. Pat. No. 6,044,019 should preferably be substantially higher than $T_{\Delta I}$. In contrast, prior art sensing of I(t) is detected more or less "instantaneously", that is, in a time substantially less than $T_{\Delta I}$, and produces the sort of output shown in FIG. 1B depending on when the measurement is made. When the integration time T is essentially zero, as in the conventional case of no time averaging, the noise fluctuation in a sensed current is given by $\Delta I$. As the averaging time is increased, the noise fluctuation in the time-averaged sensed current decreases due to increased phase cancellations.

Programming a memory cell is usually accomplished through a program/verify cycle, such as that described, for example, in U.S. Pat. No. 5,172,338 which is hereby incorporated by reference. In the typical process, a memory cell is pulsed with a programming voltage and its value is checked to determine whether or not it has reached the desired target state. If not, the process is then repeated until it is so verified. Since this verification is a sensing process, it will also be affected by noise. This is shown in FIG. 2.

FIG. 2 shows the influence of noise on a program/verify process. After each programming pulse, the state of the cell is checked through a sensing process. Referring to FIG. 2, the state of the measured parameter, I(t), after such a pulse, is shown as the value I(t) 201 that includes a noise component. As the state of the cell reflected by 201 is below the target value, the cell is again pulsed, as indicated by the blank interval, followed by a new sensing 202. As the state of the cell approaches the target value, the noise component can lead to an erroneous verification.

When the state of the cell is near the target value, the peaks in parameter due to noise may pass the target value, even through the cell is not yet in the desired state. This is shown by 204 where the peaks in I(t) cross the target value even though its average value, <I(t)>, is still not at the target value. If the verify read is performed at one of these peak values of 204, the cell could incorrectly verify instead of continuing on to the more accurate state represented by 205.

When sensing the state of a cell, whether as part of a verify operation or as a read operation, to obtain an accurate value for its state by the methods described above requires that the read period T be long with respect to the characteristic time $T_{\Delta I}$ of the noise fluctuation. This technique can have a number of shortcomings. Depending on how long this characteristic time is, this may require an excessively long read period when compared to the other operations of the memory and would result in a corresponding unacceptable loss of read speed. The present invention uses a short sense time, but repeats the process several times for a given read with the multiple sensings then averaged to obtain the state of the cell. For noise with a component having a long characteristic time, the multiple short sensings may require a combined time less than needed for the single read of the analog integration. Also, since a large number of memory cells are being read simultaneously, there are practical limits placed on the integrating analog circuits used in the integration technique.

Another limitation of the integration technique is that the <I(t)> value can be skewed by very short duration but large noise events. Such a short duration event can be isolated in a single read of the multiple sensing method and then removed along with other outlying values when the average is computed. Additionally, as the value of each of the sensed cells is separately determined a number of times, the values can be processed in a number of additional ways not available for the integration technique.

More particularly, the storage elements are read multiple times and the results are accumulated and digitally averaged for each storage element. This reduces the effects of noise in the circuits as well as other transient that may adversely affect the quality of the read. Several embodiments are discussed below. In one embodiment, a full read and transfer of the data from the storage device to the controller device is performed for each iteration, with averaging performed by the controller. Alternately, the device may perform a full read of the data for each iteration, but with the digital averaging performed by the storage device and no transfer to the controller until the final results are sent. Instead of performing a full read for each iteration, the memory may instead perform an initial full read followed by a number of faster re-reads exploiting the already established state information to avoid a full read, with some intelligent algorithm to guide the state at which the storage element is sensed. These techniques may be used as the normal mode of operation, or invoked upon exception condition, depending on the system characteristics. A similar form of signal averaging may be employed during the verify phase of programming. An embodiment of this technique would use a peak-detection scheme. In this scenario, several verify checks are performed at the target state prior to deciding if the storage element has reached the final state. If some predetermined portion of the verify fails, the storage element is programmed more. As the amount of noise is reduced, this technique can allow the system to store more states per storage element as compared to when noise and other transients are a significant factor.

The two read techniques, the digital averaging of multiple reads and the extended integration time for analog averaging, should be considered complementary. Their relative effectiveness depends on the characteristic frequency of the noise: Since the noise may arise from a number of different sources each with different characteristic frequencies, whether to use the first, second, or both techniques may depend upon the operating conditions of the device. For example, if the noise is composed of a high frequency component and a low frequency component, the integration time for each of the individual sensing operations could be taken long enough to effectively integrate out the high frequency components, while the multiple reads of the present invention could be used to reduce the effect of the low frequency component. Both the length of the integration interval and the number of re-reads can be adjusted according to the frequency characteristics of the noise. These can be set by parameters during testing and stored on the system.

An additional read technique that can be further combined with these other techniques is described in a co-pending U.S. patent entitled "Noise Reduction Technique For Transistors and Small Devices Utilizing an Episodic Agitation" by Nima Mokhlesi, Daniel C. Guterman, and Geoff Gongwer, filed concurrently with the present application and which is hereby incorporated by reference. This application describes techniques suitable when the noise has a component with a bimodal behavior.

The state of a storage element can be determined using a number of different parameters. In the examples above, the determination of a cell's stored charge level can be performed by current sensing, where the magnitude of its conduction, using fixed bias conditions, is sensed. Alternately, such determination can be made through sensing threshold voltage, where the onset of such conduction is sensed using varied steering gate bias conditions. These methods represent a couple of the more standard approaches.

Alternately, the determination could be performed dynamically by having the cells' charge-level determined driver-strength control the discharge rate of a dynamically held (by, e.g., a pre-charged capacitor) sense node. By sensing the time to reach a given discharge level, the stored charge level is determined. In this case, the parameter indicative of the cell's condition is a time. This approach is described in U.S. Pat. No. 6,222,762, which is hereby incorporated by reference, and in U.S. patent application entitled "Sense Amplifier for Multilevel Non-Volatile Integrated Memory Devices" that has been incorporated by reference above. Another alternate technique determines the state of the storage elements using frequency as the parameter, an approach described in U.S. Pat. No. 6,044,019 that has also been incorporated above.

Current sensing approaches are more fully developed in U.S. Pat. No. 5,172,338, that was included by reference above, and U.S. patent application Ser. No. 08/910,947, which is hereby incorporated by reference, and may be employed with the various embodiments described below. However, the majority of the following exposition uses the threshold voltage, $V_{th}$, sensing approach (alternately termed voltage margining) since this improves the sensing resolution, keeps the current, and consequently the power, associated with massively parallel read operations low, and minimizes vulnerability to high bit line resistance. The $V_{th}$ sensing, or voltage margining, approach is developed more fully in U.S. Pat. No. 6,222,762. Another technique of voltage sensing, monitoring the voltage at the source for a fixed drain voltage in response to a given gate voltage, is the source follower technique that is described, for example in U.S. patent application Ser. No. 09/671,793, incorporated by reference above.

The actual sensing in a voltage margining technique can be performed in several ways, for example by sequentially comparing a cell's threshold voltage to each of the associated reference values. For multi-state cells, it can be more efficient to exploit a cell-by-cell, data conditional binary search as described in above referenced U.S. Pat. No. 6,222,762, which, for example, is capable of determining, in parallel, each of the sensed cells' $V_{th}$ to a one in sixteen resolution through a sequential, four-pass sensing operation. The amount of resolution required for sensing is discussed in U.S. patent application Ser. No. 09/671,793. As usual, the degree of resolution used is often a tradeoff between higher resolution, resulting in more potential "bits" beyond the minimum required 4-bit resolution of the exemplary embodiments (e.g., for use in improving memory reliability), and cost associated with more area, to sense and store these extra bits, as well as more time consumed, both due to the additional sensing passes in the binary search of these extra bits and due to the transferring of this extra information.

It should be noted that not all of the added time for the additional sensing and processing, or possibly for an increased integration time, need be directly reflected in device speed since the device can perform many of these operations in parallel. For example, if a normal read process requires an 11 pass read operation with 3 μs per pass, the present invention may add an extra half dozen or so final read passes and potentially double the integration time if there was a noise component in the 1 μs range. This will slow nominal read time for a given cell, but offer higher storage density. Increasing parallelism could reduce the effect of this increase in single cell read time. Techniques for increasing the amount of parallelism in non-volatile memories are described in U.S. patent application Ser. No. 09/766,436, filed on Jan. 19, 2001, which is hereby incorporated by reference. Although increasing the number of operations done in parallel often itself increases noise, the present techniques will also be applicable to reducing this noise.

To extract the data stored in the memory cells, this data must be both written and stored with sufficient fidelity. Consequently, to achieve such fidelity, minimizing the effects of noise are important in the verification parts of the programming operation as well as in the actual reading operation when the state of the cell is converted into a data value.

FIG. 3 is a schematic block diagram of the operation of the present invention according to an exemplary embodiment. The gate voltage on the cell 301 is set and its bit-lines are pre-charged. During the integration portion of the read phase, the voltage V(t) (including the noise component) is supplied to a sense amplifier SA 310 with an analog to digital converter A-D 311. Sense amplifier SA 310 converts this voltage into an output data state $\Phi_i$. The operation of the sense amp can be as described in U.S. patent application Ser. No. 09/671,793 that was incorporated by reference above, for example. As described there, the voltage level is sensed with a resolution of $2^7=128$ states to be used in discriminating cells storing 4 or 5 bits per cell. The cell is read several times, each producing a data state $\Phi_i$. Due to noise, and the use of an integration time shorter than the characteristic time of the noise, the $\Phi_i$ will be output with a spread much as is shown in FIG. 1B.

The data states $\Phi_i$ are then averaged. This can be done in a number of different ways, as is described below, with a simple exemplary embodiment shown in FIG. 3. The averaging circuit AVE 320 consists of an accumulator $\Sigma_i$ 321 and a divider 323. For example, the data state could be measured eight times, the result accumulated in 321 to produce $$\sum_{i=1}^{8} \Phi_i,$$

and the divider 323 could be a shift register, which when shifted three times will divide the sum by eight. The output $\overline{\Phi}$ of AVE 320 is then the average read value, in this example a simple mean.

A memory system normally consists of one or more memory chips, each of which contain the actual arrays of memory cells, plus a controller chip, although in a single chip embodiment the controller function may be integrated into the same chip as that within which the array is contained. Although the read circuitry SA 310 will be located on the same chip as the memory cells, both the location and operation of the averaging circuit AVE 320 can have a number of different embodiments. More particularly, exactly how the average $\overline{\Phi}$ is formed from the individual reads, along with the type and location of the circuitry involved in forming this composite, have a number of possible variations. For example, the circuit AVE 320 of FIG. 3 could be placed entirely on the same circuit as the memory cell so that only the composite value $\overline{\Phi}$ is transfer back to the controller at the end of the process. Alternately, each of the individual $\Phi_i$ could be transferred to the controller and averaged there.

Although the specifics will vary with the embodiments described below, a pair of generic situations is shown in FIGS. 4A and 4B. These show a memory chip MEM 400 and a controller CONT 460. The memory chip contains the array of memory cells 401 to which are connected the row decoder circuitry 411 and column decoder circuitry 413. The read circuit 421 will contain the sense amplifiers, such as block 310 of FIG. 3, as well as any other associated circuitry. The output of the read circuit is then supplied to a set of registers 425, which may be absent depending on the embodiment. Although this discussion is mostly given in terms of a single cell, generally a large number of cells are read in parallel and the registers and other elements must support this parallelism. The other elements of the circuit are suppressed to simplify the discussion, but are described more fully in the various patents and applications that are incorporated herein by reference. For example, the circuit will also contain write circuits that are not explicitly shown, but that can be taken as incorporated into the read or other blocks, and a set of programming registers that may be the same as the read registers 429. The bus 430 connecting the memory portion 400 to the controller 460 will transfer data as well as addresses, commands, parameters, and so on between the two. The controller 460 will also have all the usual elements in addition to those specifically shown.

FIG. 4A is an embodiment wherein the individual reads, $\Phi_i$ (or $\Phi_0$ and $\Phi'_i$ as described below), are all sent from the memory to the controller. These values may be stored temporarily in REG 425 on MEM 400 before being sent to the controller CONT 460. Once in the controller, the values may be stored there in REG 461 or other memory and the average $\overline{\Phi}$ formed in circuit AVE 463 before being output to the host. In the case where AVE 463 accumulates the values as they arrive from MEM 400 to form a running average, the values need not be individually stored in the REG 461.

The variation of FIG. 4B shows an example in which the composite $\overline{\Phi}$ is formed on the memory MEM 400 and then passed to the controller to be output to the host. The embodiment shown in FIG. 4B shows an averaging circuit like FIG. 3, consisting of an accumulator 423 and a divider 429 to form a mean $\overline{\Phi}$ from the individual reads. Alternate implementations on the memory chip would have other or additional elements, such as the set of registers 425 in FIG. 4A that are not shown here in order to individually store the read values.

For any of the embodiments, the basic read process of the present invention consists of concurrently supplying a parameter set p(t), such as a voltage or current, indicative of the state of the cell, to the read circuit for each of the cells of the set being read in parallel. To do this, the cells to be read are biased according to the read technique being used. The parameter p(t) will contain a noise component. The read circuit then produces the data states $\Phi_i(p)$ corresponding to the biasing conditions from which the composite value $\overline{\Phi}$ is then formed and output from the controller.

In a first set of embodiments, all of the reads of the cells are full reads; that is, if the cell is being read to a resolution of, say, 7-bits such as described in above referenced U.S. patent application Ser. No. 09/671,793, all of the reads are to this resolution, including all steps required to sense the full resolution, and passed on to the controller. These data states may be used to form a running average, such as shown in the averaging circuit 320 of FIG. 3, or else stored on the controller in the register 461 of FIG. 4 or other controller memory. By storing all of the measured data states, the controller can perform a wider variety of averaging processes. The data states can either be transferred from the memory circuit 400 as they are determined, or temporarily stored in the register 425 prior to transference.

From the measured values, a number of different composites can be formed in the controller. This composite could be a simple mean, weighted mean or mean with outlying values neglected, or a root mean square or mean based on other powers and be implemented through hardware, software, or firmware. A controller-based implementation can consequently be used without the introduction of extra circuitry, aside from possibly increasing the storage capacity. This sort of implementation does result in the largest amount of information transfer between the memory circuit and controller circuit of the described embodiments, which can be a drawback, particularly when the controller and memory circuit are on separate chips due to the increased bus traffic. A purely memory-device-based implementation would require the introduction of additional circuitry, possibly including sufficient register capacity to hold the results from the multiple reads for all of the cells being read in parallel.

One way to reduce the amount of information transferred to the controller is to do one full read on the cell, followed by a number of partial reads, with partial reads requiring fewer bits to indicate offset from baseline, where offset is limited in range. This would result is a base value $\Phi_0$ for the data state and a number of reads $\Phi'_i$ showing the fluctuation about this base value due to noise. As this method produces less data to analyze (and possibly store), this saves both on the amount of data that needs to be transferred to the controller, if the averaging is performed there, and possibly on the time for the analysis to be performed, even in embodiments where the averaging is performed on the memory chip. It can also reduce the total read time.

Consider the case where the state of the memory cell is determined with a resolution of 7-bits. If the read uses a binary search technique, this would require at least seven reads at seven break points. Consequently, a full read of the state of the cell repeated four times would require a minimum of 28 sensing operations. If instead one full read is performed on the cell to determine $\Phi_0$ followed by three reads with a 2-bit resolution to determine the fluctuations $\Phi'_i$ around the base $\Phi_0$, this would result in 13 sensing operations. In this example, the set $(\Phi_0, \Phi'_i)$ will contain the same information as the full reads with less than half the sensing operations and less than half the data that need to be stored, transferred, or both. This of course assumes that the magnitude of the fluctuations is within the range that is measured about the base level. (Alternately, this will remove the effect of fluctuations of greater magnitude due to a saturation effect.) The range and number of the partial reads can be set by system parameters and determined during testing of the chip and may also be altered in response to system conditions. In a noisy circuit, the partial reads may need to be set to cover a larger range. For most arrangements, the best accuracy for a given number of sensing operations is obtained by having roughly the same number devoted to determining $\Phi_0$ as to the $\Phi'_i$.

The binary search example may require a change of algorithm, as is shown in the schematic representation of FIG. 5 for one of the cells being read in parallel. Continuing with the previous example, to read the state of the cell with a 7-bit resolution could use 128 voltage break points. The first read in the series would determine if the cell is in the upper or lower half of the memory window, with the second read determining if the cell is in the upper or lower half of the previously determined half, and so on.

Consider such a binary search where, for example the cell is in the $64^{th}$ state, lying just above the level $V_{64}$ in FIG. 5. Without noise in either the cell or other circuit elements, it would read in the $64^{th}$ state. Consequently, it would read above the break point in the first read (501a) and below the break point in each subsequent read (501b–501g). This is represented in FIG. 5 by the direction arrow that indicates whether the measure voltage is above or below the break point used to read the cell. With noise, it could read above or below this by several states. However, to determine the effects of this noise, just using the last few steps of the algorithm (say 501f and 501g) could never capture a value less than the first breakpoint. To properly reflect the effects of the noise would either require full 7 step reads or a change of algorithm. Consequently, a full binary search can be used to determine a base level $\Phi_0$ from the full read algorithm followed by a second mode to determine the $\Phi'_i$. The multiple, faster re-reads could use a reduced binary search centered about $\Phi_0$ or switch to a non-binary method.

FIG. 5 shows the use of a reduced binary search for the re-reads 511, 513, and 515. Again, the first seven reads (501a–501g) determine the base state $\Phi_0$ is the $64^{th}$ state. As a fluctuation about this state could easily be below the first read level 501a, any subsequent reads using the same algorithm would miss these. Consequently, to accurately determine the $\Phi'_i$ corresponding to this $\Phi_0$, the algorithm changes to a reduced binary search centered on the state $\Phi_0$. FIG. 5 shows three partial reads (511, 513, 515) each consisting of a 2-bit binary search (a and b) centered on the value of the full read.

In this example, the first of these results reads above both the first break point (511a) and the second break point (511b), corresponding to the $65^{th}$ state. Note that although the real result may be well above this state due to a momentary large fluctuation, a "saturation" effect occurs, in effect limiting the amount such a spike will contribute to the average. The second set of re-reads yields a result below the first breakpoint in 513a, followed by a read above the second breakpoint in 513b, corresponding to the $63^{rd}$ state. Similarly, the re-reads of 515a and 515b again return the $64^{th}$ state. Thus in this example, the first read for $\Phi_0$, contains 7-bits of data for each cell being read, while each of the re-reads contain 2-bits of data, or a total of 6-bits for the entire re-read process.

The process of FIG. 5 is one example of a read operation having a first read mode where the cell is only read once and a second mode where the cell is read multiple times. In another example, in which the measured parameter of the cell is compared to a number of reference levels in parallel, the first read could be a coarse mode where some number of the most significant bits are read followed by multiple reads for the remaining least significant bits. In a further example, during a verify process such as is shown in FIG. 2, during the early stages when the cell is far from the target value (such as in 201), the cell could be read only once, with a change of reading mode as the cell approaches the target value (such as in 204 and 205). The use of a programming technique having a coarse mode and a fine mode is described in U.S. patent application Ser. No. 09/793,370 filed Feb. 26, 2001, which is hereby incorporated by reference.

Returning to FIGS. 4a and 4b, as already noted any of these embodiments can be implemented by transferring all of the data, either the multiple full reads $\Phi_i(p)$ or the set of multiple partial read and one full read $(\Phi_0, \Phi'_i)$, to the controller 460 and processing it there, as depicted in FIG. 4a. Alternatively, all of the processing could be done on the memory chip with only the final result $\overline{\Phi}$ transferred to the controller and then to outside of the system, as depicted in FIG. 4b. The processing could also be split, with the reads transferred in an intermediate state. For example, the partial reads could be accumulated on the memory chip and then transferred to the controller for division or other further processing.

Another example in which the processing is split between the controller and the memory chip involves the use of reference or tracking cells, such as those described in above the referenced U.S. patent application Ser. No. 09/671,793. This application describes a method in which the tracking are cells are read with a 7-bit resolution in order to determine breakpoints for reading the data cells with a 4-bit resolution. In this method, the tracking cells could be read multiple times according to the present invention with the composite formed on the controller. Once the breakpoints are determined using the present invention, these breakpoints would then be transferred back to the memory chip to read the data cells.

One method for determining the composite on the memory chips would be to form a running average on the memory circuit 400. This could be an accumulator and division circuit corresponding to block 320 of FIG. 3. Alternately, the values could be accumulated by element 423, stored in register 425, and then transferred to controller 460 for further processing. The read values could also be first be individually stored in the register 425 and then processed by other circuitry on the memory chip as described above for the controller implemented examples.

Implementing the averaging on the memory circuit 400 will generally have the cost of introducing additional elements on the circuit that are usually not included. Depending on how the mean or other composite is formed, this could include some combination of increased register size for storing read values, the introduction of additional circuitry, division circuitry, some sort of state machine, and so on. On the other hand, the resultant reduction in the amount of information that needs to be transferred to the controller can be particularly advantageous in the program verify process for maintaining high write speed.

As described in U.S. Pat. No. 5,172,338 and other references incorporated by reference herein, a typical programming process in a floating gate type memory cell consists of pulsing the cell to change its state, reading the cell to determine if it has achieved the desired state, terminating further programming if so and if not continuing the pulse-read cycle until the cell is verified to have achieved the desired state. The effect of noise was discussed above with respect to FIG. 2. To store and accurately retrieve data in a memory requires accuracy in both the writing and reading process. Referring to FIG. 2, the mean value of 205 corresponds to the desired state; however, if the programming were stopped in response to peak values of 204 reaching above the target level, this would result in state with a lower mean being verified as correct. This error may then be compounded by noise during the read process. Consequently, reducing the consequences of noise in the verify process is equally important as the density of the states stored in each single cell increases.

The different aspects of the present invention can be incorporated into the verify process in a number of ways. The verify situation differs from the standard read process in that state of the cell is being measured against a data dependent target value of the measured parameter that the iterative programming algorithm must satisfy, as opposed to searching through a reference parameter space to determine the actual state of the cell. In other words, not as much information and processing is typically involved in program verify, only whether or not it has passed a given reference value. One embodiment of this technique would use a peak-detection scheme. Alternatively, other detection means, such as analog filtered average detection may be used. In this scenario, several verify checks are performed at the target state prior to deciding if the storage element has reached the final state. If some predetermined portion of the verifies fail, the storage element receives additional programming. For example, although the state corresponding to 204 in FIG. 2 has peaks that would cross the target value twice if multiple more or less instantaneous reads were performed on the cell, it would read over the target value no more than twice. In contrast, the state corresponding to 205 would read over the target value a majority of times.

To perform multiple reads when the state of the cell is still far from the desired state would greatly slow the process for little increase in accuracy. Consequently, in the early stages of the programming process when the cell is still far from the target value (for example, 201 in FIG. 2), the standard single read mode can be used, with a transition to the second mode as the target state is approached. This will happen after a different number of pulses for different states, with the transition occurring sooner for lower lying states. For example, the transition could be triggered by the first verify level having a peak to pass the target level (such as 204 in FIG. 2) or as part of the transition from a coarse programming mode to the fine programmed as described in U.S. patent application Ser. No. 09/793,370 incorporated above.

Another example of two-mode operation is that of the multiple-read mode which is invoked upon exception condition, with the standard, single read mode being used otherwise.

Another example of two-mode operation is that where a first mode uses a standard, single read and a second mode uses multiple reads. The multiple-read mode is invoked upon exception condition, with the single read mode being used otherwise. For example, the error correction code (ECC) is a prime indicator of a problem, or exception, in device operation. When the error level on the memory exceeds a predetermined value (for example, grater that one bit), the multiple read technique could be invoked.

An exception condition could also be based on reading of tracking or reference cells. As described above, in one embodiment the reference cells are read with a 7-bit resolution while the data cells are read only to a 4-bit resolution. Consequently, the reference cells will be more sensitive to noise. By using the reference cells to monitor the noise level, a flag to invoke the multiple read technique could be raised if the noise level is found to exceed a threshold when the tracking cells are processed.

Although the discussion so far has focussed on embodiments using a charge storing device, such as floating gate EEPROM or FLASH cells, for the memory device, it can be applied to other embodiments in which this type of noise is a problem, including magnetic and optical media. This invention can have far reaching applications in all types of device/transistor sensing, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used. Using this approach, systems that are presently non-practical due to noise may become viable technologies. For these other types of storage elements, the particular mechanics of determining the parameter that reflects the state of the element may differ, for example magnetic properties would be measured in a magnetic medium and optical properties would be measured in a CD-ROM or other optical media, but the subsequent process follows readily from the examples above.

Although the various aspects of the present invention have been described with respect to specific exemplary embodiments, it will be understood that the invention is entitled to protection within the full scope of the appended claims.

It is claimed:

1. A method of writing a target data value in a non-volatile memory, comprising:
   performing one or more program-verify cycles using a first verify mode having a single comparison to a first-mode reference value; and
   performing one or more program-verify cycles using a second verify mode, the program-verify cycles using a second verify mode including:
      altering the state of a storage element in the non-volatile memory;
      verifying a parameter indicative of the resultant state of the storage element against a second-mode reference value indicative of the target data value by performing a plurality of independent comparisons to compare the parameter to the second-mode reference value indicative of the target data value; and
      determining whether to further alter the state of the storage element in response to said verifying.

2. The method of claim 1, wherein the storage element is a multi-state storage element.

3. The method of claim 1, wherein the storage element is a charge storing device.

4. The method of claim 3, wherein the storage element is a multi-state storage element, and wherein the comparisons are performed using a digital numerical technique.

5. The method of claim 3, wherein the storage element is a multi-state storage element, and wherein the comparisons comprise a peak detection method.

6. The method of claim 3, wherein the storage element is a multi-state storage element, and wherein the comparisons comprise an analog filtered average detection.

7. The method of claim 1, wherein the transition from the first verify mode to the second verify mode is in response to the parameter indicative of the resultant state of the storage element exceeding a first mode verify level.

8. The method of claim 1, wherein the transition from the first verify mode to the second verify mode is in response to a transition from a coarse programming mode to a fine programming mode.

* * * * *